United States Patent [19]

Fisher

[11] 4,097,770

[45] Jun. 27, 1978

[54] SCR TRIGGER CIRCUIT

[75] Inventor: Michael Scott Fisher, Bridgewater, N.J.

[73] Assignee: RCA Corporation, New York, N.Y.

[21] Appl. No.: 695,197

[22] Filed: Jun. 11, 1976

[51] Int. Cl.2 .......... H03K 17/72

[52] U.S. Cl. .......... 307/252 J; 123/148 E; 307/252 M; 315/209 SC

[58] Field of Search ...... 315/209 T, 209 CD, 209 SC; 307/252 J, 252 M, 252 W, 293, 362; 123/148 E, 148 CB; 340/365 E

[56] References Cited

U.S. PATENT DOCUMENTS

| | | | |
|---|---|---|---|
| 3,408,993 | 11/1968 | Chavis | 315/209 SC |
| 3,473,054 | 10/1969 | Wieczorek | 307/293 |
| 3,484,624 | 12/1969 | Rasiel et al. | 307/262 R |

*Primary Examiner*—John Zazworsky

*Attorney, Agent, or Firm*—H. Christoffersen; Allen LeRoy Limberg; John M. O'Meara

[57] ABSTRACT

Circuit for producing turn-on signal for a silicon controlled rectifier (SCR), which signal abruptly and automatically returns to a lower level at which the SCR can commutate off upon reversal of its anode voltage. When a switch opens, a capacitor starts to charge and when the charge reaches a given level, a normally reverse biased transistor turns on. In response to the turn on of the transistor, a turn-on signal is applied via a second capacitor to the gate electrode of the SCR. After a short interval, a second transistor responsive to base current flow through the first transistor, clamps the gate electrode of the SCR to said lower level. After turn off of the SCR, the switch closes and the second capacitor discharges through a circuit including the gate-to-cathode path of the SCR, reverse biasing the gate of the SCR and holding the latter off.

15 Claims, 4 Drawing Figures

SCR TRIGGER CIRCUIT

The present application relates to a triggering circuit for a silicon controlled rectifier (SCR). This type of circuit finds use, for example, in capacitor discharge automobile ignition systems.

Figure 1:
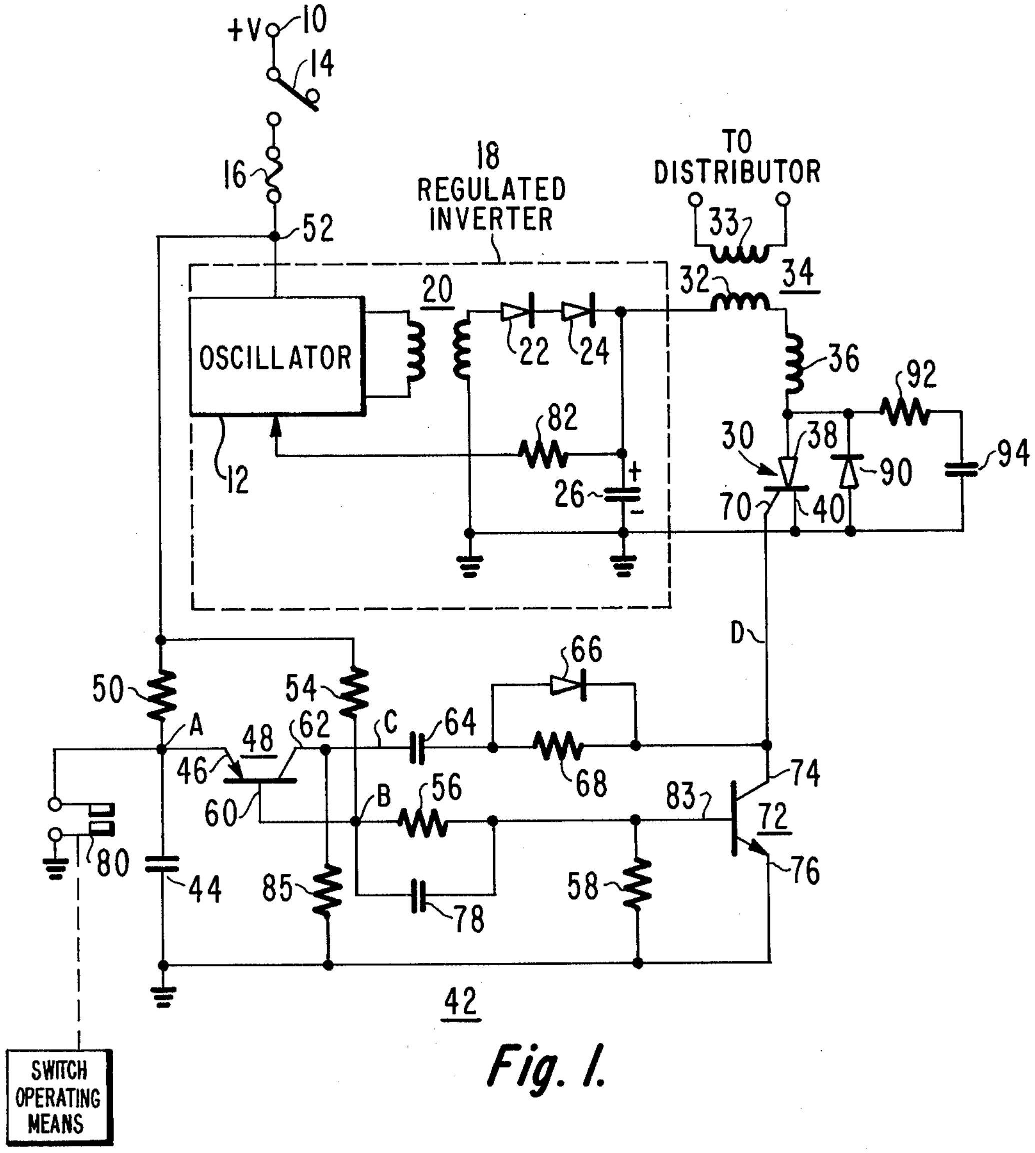
FIG. 1 is a block and circuit diagram of a portion of an automobile ignition circuit embodying the invention.
Figure 4:
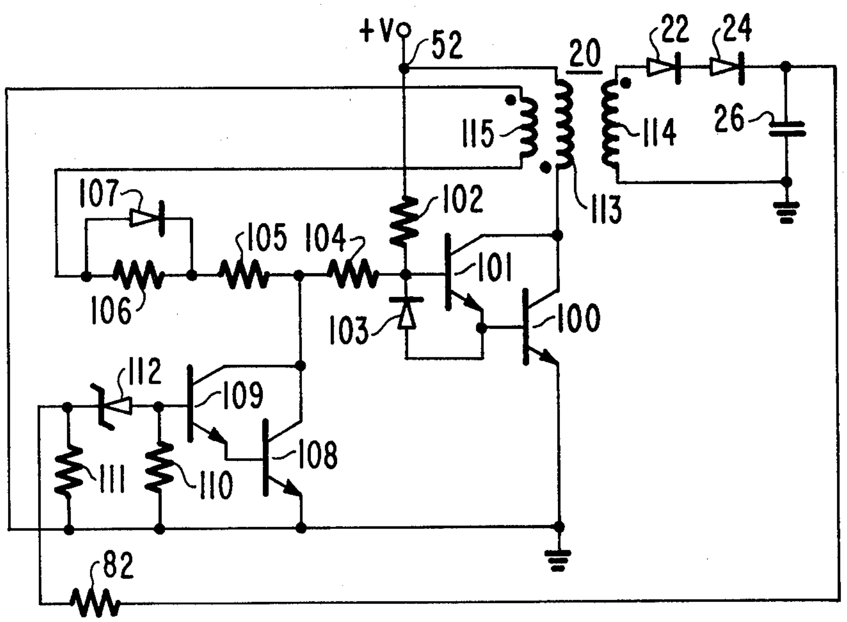
FIG. 4 is a schematic circuit diagram of an oscillator which is suitable for use in the circuit of FIG. 1.

The circuit of FIG. 1 includes terminal 10 to which a positive operating voltage +V, such as supplied by an automobile battery, may be applied. Terminal 10 connects to an oscillator 12 via switch 14 and a fuse 16. When employed in the environment of a motor vehicle, it should be rugged and preferably one which employs solid state devices. One which is suitable is illustrated in FIG. 4. The oscillator forms part of a regulated inverter 18 which includes also a transformer 20, rectifying diodes 22 and 24, resistor 82 and a capacitor 26.

The capacitor 26 serves as a power source for SCR 30. The capacitor is connected at one terminal through the primary winding 32 of a transformer 34 and through a choke winding 36 to the anode 38 of SCR 30. The purpose of winding 36 is to prevent damage to the SCR in the event of a short across winding 32. The cathode 40 of the SCR is connected to a point of reference potential, shown here as system ground.

The voltage +V also serves to power the triggering circuit shown generally at 42. The latter includes a capacitor 44 which is connected between the emitter electrode 46 of PNP transistor 48 and ground. Resistor 50 connected at one terminal to node 52 supplies the charging current for capacitor 44. A voltage divider comprising resistors 54, 56 and 58 supplies a bias potential to the base electrode 60 of transistor 48. The collector electrode 62 of the transistor is connected through capacitor 64 and the network comprising diode 66 and resistor 68 to the gate electrode 70 of the SCR.

A second transistor 72, this one of NPN type, is connected at its collector electrode 74 to gate electrode 70 and at its emitter electrode 76 to ground. A capacitor 78 is connected across resistor 56. A switch, such as points 80, is connected across capacitor 44. The points may be mechanically connected to the drive shaft of a vehicle by gearing or other means for operating the contacts thereof between closed and opened positions. These points therefore open and close in synchronism with the movement of the pistons of the engine associated with the system.

In operation, when switch 14 is closed, power is applied to the oscillator 12 and it begins to oscillate. The oscillations thereby produced are supplied through the transformer 20 to the circuit including rectifiers 22 and 24. They rectify the alternating current and the capacitor 26 becomes charged in the sense indicated. The feedback connection via resistor 82 serves to regulate the oscillator. The regulation is such as to cause the voltage across capacitor 26 to reach a given level and to remain at that level until the SCR fires.

The capacitor 26 forms with the inductances of winding 32 and coil 36 a tuned circuit and when the SCR fires, this circuit attempts to "ring" at the frequency to which the circuit is tuned. In the ringing process, capacitor 26, which is initially charged in the polarity shown, becomes discharged and starts to charge in the reverse direction. This forward biases diodes 22 and 24 and the current which thereby flows through the secondary winding of transformer 20 induces a voltage in the primary winding 32 in a sense to tend to turn off the oscillator. The oscillator pauses during this interval but resumes its oscillations as soon as this transient phenomenon terminates.

When the SCR is triggered on, current flows through primary winding 32 and energy becomes stored in transformer 34.

The purpose of RC circuit 92, 94 is to prevent too sudden an increase in the voltage at the anode 38 of the SCR when the SCR is turned off. This prevents premature refiring of the SCR. The purpose of diode 90 is to conduct the negative portion of the ringing period. When the anode 38 attempts to go negative, the diode 90 conducts the negative swing. Then, within a period after the time anode 38 goes negative, the negative ringing ceases, the SCR has been turned off, and capacitor 26 is again ready to accept charge from the inverter. This is discussed in more detail later.

In the operation of the triggering circuit 42, during the time the points 80 are closed, the emitter electrode 46 is at ground potential or close to it. The capacitor 44 is discharged, the discharge having previously occurred through the points 80. The voltage divider 54, 56, 58 places the base electrode 60 at a voltage equal to roughly V/4. This can be considered the reference voltage level and its value will depend upon V; that is, if V varies, the voltage B will vary correspondingly. It is advantageous in the present circuit that this be the case because even if V should decrease in value, it will still permit transistor 48 to be turned on in the manner to be described shortly and the SCR to be fired. Maintaining B at a positive value also has the advantage that it maintains the transistor 48 off at a substantial reverse bias level during the time points 80 are closed and thereby imparts a high degree of noise immunity to the circuit over a range of values of V. Of course, the higher B, the greater the noise immunity.

During the time transistor 48 is cut off by the reverse bias across its base emitter junction, the gate electrode 70 of SCR 30 is either reverse biased by capacitor 64 (as will be explained shortly) or, in the case of very low engine speed or stalling of the engine, the gate electrode is at zero volts. Thus, no triggering occurs.

Transistor 72 is turned off at this time unless +V, for one reason or another, increases to a relatively high value. In one particular design the value of +V normally was +12 to +14 volts and transients sometimes occurred which increased +V to much higher values. In this circuit if +V goes as high as +33 volts, the voltage developed across resistor 58 of the voltage divider 54, 56, 58 becomes sufficiently positive that transistor 72 turns on. Any time this transistor turns on, it places the gate electrode 70 of SCR 30 close to ground potential and attenuates the signal level thereat. With the gate electrode at this level, the SCR is prevented from being triggered during positive transients of the supply voltage. Thus, transistor 72 operates as a transient protection circuit.

Figure 2:
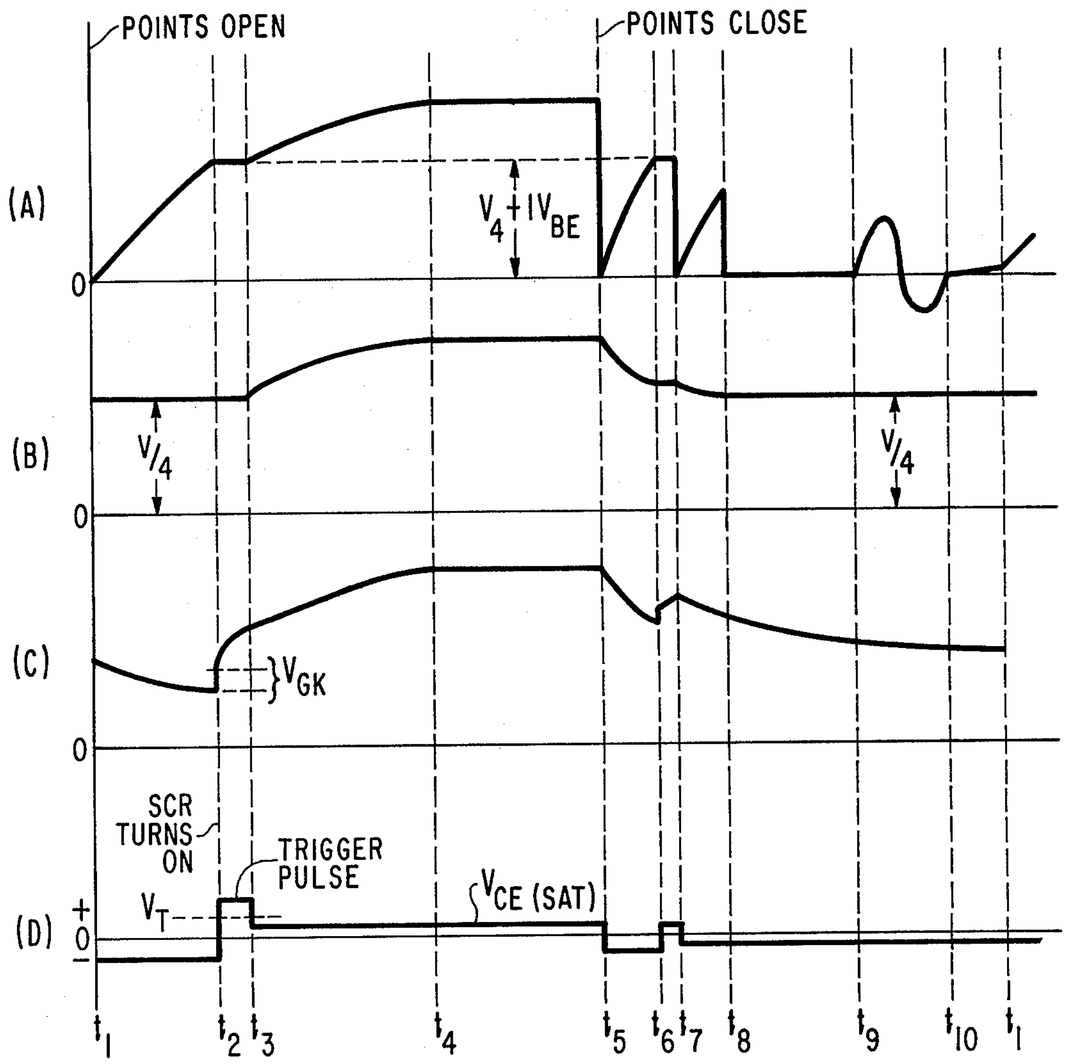
FIGS. 2 and 3 are drawings of waveforms which are useful in explaining the operation of the circuit of FIG. 1.

Both FIGS. 1 and 2 should be referred to in the discussion which follows. Points 80 open at time $t_1$. This removes the short from across capacitor 44 and it starts to charge toward the +V level. Base electrode 60 of transistor 48 remains clamped at its previous level which, for purposes of the present discussion, may be assumed to be V/4. At time $t_2$, the potential A at the emitter electrode has risen to a value equal to one base emitter junction drop ($1V_{BE}$) above the base electrode potential and transistor 48 turns on. The emitter voltage is now clamped to a level $1V_{BE}$ above the base voltage so that during the period $t_2$ to $t_3$ the voltage A remains constant.

The emitter-to-collector current of transistor 48 now flows through the capacitor 64 and diode-resistor network 66, 68, to the gate-to-cathode circuit of SCR 30, triggering the SCR into its on condition. The voltage C at the collector 62 rises quickly when transistor 48 turns on (time $t_2$), allowing capacitor 64 to pass a differentiated pulse. The jump in voltage C (shown as $V_{GK}$ in FIGURE 2) results from a corresponding jump in voltage D at the gate electrode of the SCR plus the jump across diode 66 (if used). The amplitude is such that the SCR conduction threshold $V_T$ is exceeded and the SCR turns on. Once the SCR turns on, the voltage D is clamped (during the period $t_2$–$t_3$) to the gate-to-cathode junction voltage level, which explains the flat portion of D during $t_2$–$t_3$. During $t_2$–$t_3$, the collector current of transistor 48, which current passes through capacitor 64, charges the same, and thus is manifested as an increase in the voltage C.

At time $t_3$ the voltage C has risen enough to cause transistor 48 to operate at saturation. The voltage C now can rise only if the voltages at A and B rise. With transistor 48 in saturation, heavy base current flows through transistor 48 and from it through capacitor 78 (and resistor 56 in parallel therewith) and into the base 83 of transistor 72. This turns on transistor 72 which also operates in saturation and the voltage D at the gate electrode 70 drops to a value $V_{CE(SAT)}$ above ground. This drop in gate voltage does not turn off the SCR because its anode is still at a positive potential. But it places the gate 70 at a level such that the SCR can be "commutated" (turned off) by the reversal of the voltage at its anode.

During the period $t_3$ to $t_4$, the voltages A, B, and C rise together and capacitors 44, 78 and 64 charge toward the supply level +V. Transistor 48 is operating in saturation. Transistor 72 operates in saturation and provides noise immunity.

Figure 3:
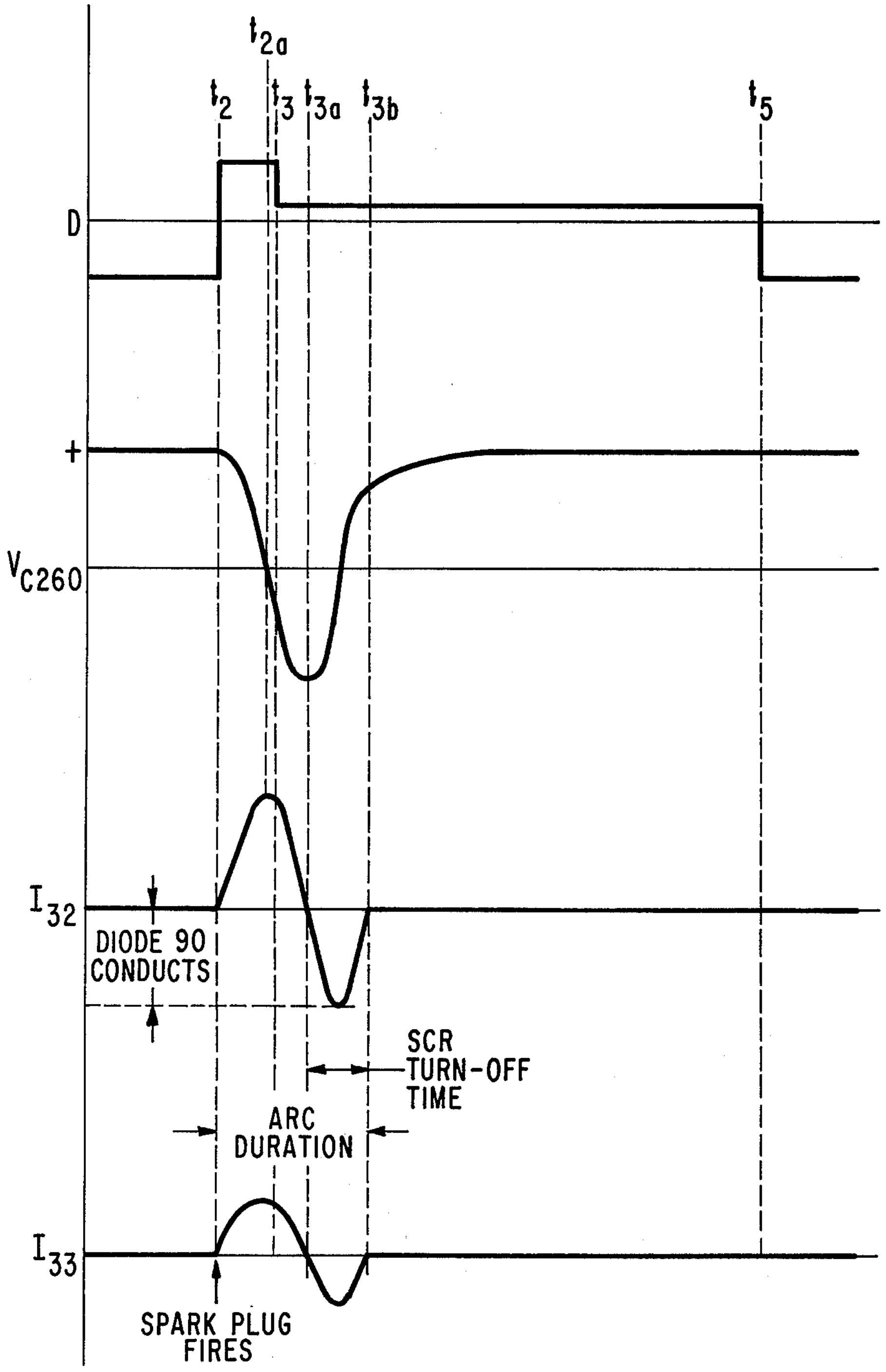

FIG. 3 illustrates what occurs in the circuit 26, 32, 30 from the time $t_2$ to the time the SCR turns off (the scale is somewhat expanded relative to FIG. 2). At time $t_2$, the capacitor 26 starts to discharge via primary winding 32 and into the anode-to-cathode circuit of the SCR. The spark fires almost immediately thereafter. The current $I_{32}$ passing through the primary winding 32 increases with time and reaches its greatest positive level at time $t_{2a}$ when the rate of change of voltage across the capacitor 26 is greatest. The current through the primary winding 32 now starts to decrease, going through zero at the negative peak of the voltage across the capacitor 26. This occurs at time $t_{3a}$. Now the negative portion of the ringing cycle starts and diode 90 starts to conduct. It continues to conduct for the period $t_{3a}$ to $t_{3b}$. By the time $t_{3b}$, the SCR has turned off and it no longer conducts current through its anode-to-cathode path. The spark duration is from the period $t_2$ to $t_{3b}$. Times $t_{3a}$ to $t_{3b}$ will occur within the interval $t_3$ to $t_5$ of FIGURES 2 and 3. These times will depend upon the ringing period (single cycle) of the resonant circuit which includes the capacitor 26 and the inductance associated with transformer 34 and coil 36, and are matters of engineering design. The SCR, however, is usually off by the time $t_5$ when the points 80 close.

The period $t_{3a}$–$t_{3b}$ is legended "SCR turn-off time" in FIG. 3. The actual forward current goes off when the cycling current reverses (time 3*a*). No current now flows through the SCR, but it can't necessarily be considered "off" until the depletion regions have built up and established the SCR's ability to handle reapplied forward voltage, which happens no later than the time $t_{3b}$ when the negative current flow stops.

The waveforms illustrated in FIG. 3 are minimum pulse widths which occur when the secondary winding 33 has a "low voltage" termination and when a minimum secondary leaking inductance coil is used. The capacitor voltage does not return to its original value at the end of the pulse (time $t_{3b}$) because of the power (and thus energy) which has been lost, that is, the power manifested as secondary current $I_{33}$ flowing through an ionization voltage drop. However, much of the stored energy is recovered in this system and this allows use of a relatively large capacitor 26 which in turn results in high spark plug current and long arc duration.

During the period $t_4$ to $t_5$, the three capacitors 44, 78 and 64 are essentially fully charged and the circuit remains at rest until the points close.

The points close at time $t_5$, almost immediately bounce open again, reclose at time $t_7$, and bounce open again finally closing at $t_8$. When the points initially close (time $t_5$) capacitor 44 discharges almost immediately through the points and voltage A goes to ground or close to it. Capacitors 64 and 78 discharge through the circuit which includes the base-collector junction of transistor 48. This discharge circuit includes the path through resistor 58 to ground and also from ground through the cathode-to-gate circuit of SCR 30 and resistor 68. There is also a shunt path, resistor 85, for the discharge of capacitor 64, thus shunt path also including the cathode-to-gate circuit of SCR 30 and resistor 68.

The direction of discharge (time $t_5$) is such as to drive the gate electrode 70 negative as shown at D in FIG. 2. This negative voltage on the gate 70 of SCR 30 prevents noise from re-triggering the SCR. The impedance of the discharge path is sufficiently low (for example, 68 may be in the range 0–2.2 K ohms and 58 may be 27 ohms), that the voltage D changes from $V_{CE(SAT)}$ to a negative valve substantially instantaneously.

The discharge of capacitor 78 continues until the voltage B reduces from its relatively higher positive level to the reference positive level V/4. Capacitor 64, however, continues to discharge through resistor 85 toward ground. As long as capacitor 64 is discharging, the gate electrode 70 is held negative, keeping SCR 30 off. Note in FIG. 2 the negative voltage level from $t_5$ to $t_6$ at D.

The waveforms show how the circuit is able to discriminate against the point bounce which occurs between times $t_5$ and $t_8$. Before capacitor 64 can deliver another firing pulse, the voltage C must fall below the voltage B so that it will be possible for the voltage C rapidly to rise again to cause the gate electrode 70 to go sufficiently positive to exceed the threshold level of the SCR. For a time, voltages C and B fall together. At time $t_6$, voltage A reaches a value sufficiently high to turn on transistor 48. But the change in level of C is insufficient to turn on the SCR because C initially was higher than B. Note the relatively small pulse at D (time $t_6$–$t_7$). At time $t_8$, the voltage A has not yet reached the reference level at B so that transistor 48 does not turn on and there is no change in the level of the gate voltage D. When B reaches the DC level of V/4, the voltage C continues to fall (at about time $t_8$) and at about time $t_9$ the voltage is low enough to C to provide a trigger pulse, if demanded.

The waveforms show, during the period $t_9$ to $t_{10}$, what occurs when a relatively high level noise signal is impressed at point A. This causes no circuit action because the noise level, even though high, does not exceed the V/4 base bias level by $1V_{BE}$ and therefore does not turn on the transistor 48.

One complete period is illustrated in FIG. 2 from the time $t_1$ through $t_{10}$ to the time $t_1$. At time $t_1$, the switching points open again and a new period starts.

The diode 66 provides a low impedance path for the triggering pulse. The resistor 68 is for the purpose of controlling the rate of discharge of capacitor 64. The higher the value of the resistance, the slower the discharge and the greater the immunity to high repetition rate noise (such as switch bounce), that is, the greater protection against premature turn on of the SCR immediately after closing the points Diode 66 and resistor 68 may be omitted from the circuit and in this case other elements in the discharge path of capacitors 64 and 78 will control their rate of discharge, still limiting the maximum repetition rate of the circuit.

An oscillator suitable for use in the system of FIG. 1 is illustrated in FIG. 4. When +V is applied to terminal 52, current flows through resistor 102 and into the base of the Darlington pair 100, 101 turning these transistors on. Current now flows through the primary winding 113 of transformer 20 in a direction to induce a voltage in the feedback winding 115 which causes current flow through the resistor network 106, 105, 104 and diode 107, which is in shunt with resistor 106, in a sense to hold the Darlington pair on. During this time, the voltage induced in the secondary winding 114 of transformer 20 is in a direction to reverse bias the rectifying diodes 22 and 24.

Current increases through the primary winding 113 storing energy in the transformer 20. When this current attempts to go higher than what is capable of flowing through the Darlington pair with the amount of base current supplied to this pair, the voltage at the collector electrodes of the Darlington pair rises and the voltage across the primary winding 113 decreases correspondingly. This reduces the feedback via winding 115 and the base drive current and the Darlington pair starts to turn off. As these transistors 100 and 101 turn off, their collector voltage goes above +V and all of the transformer voltages reverse. This causes negative, or turn off base current to flow through the emitter-base junction of transistor 100, diode 103, and the emitter base junction of transistor 101 and then through the resistors 104, 105 and 106.

Diodes 22 and 24 are now forward biased and the energy previously stored in transformer 20 causes current to flow through these diodes and into capacitor 26. The voltage developed across the capacitor 26 clamps the secondary winding voltage and in turn, the primary and feedback voltage. The collector voltage of the Darlington pair 100, 101 rises to a value +V plus the quotient of the voltage across the capacitor divided by the turns ratio of secondary winding 114 to primary winding 113. The secondary current decays almost linearly until all of the energy is taken from the transformer and put into the capacitor. Then the current stops, the collector voltage falls and the cycle starts over.

The capacitor voltage rises to the point where the divided down capacitor voltage appearing across resistor 111 is sufficient to bias zener diode 112 plus the base emitter junctions of transistor 108 and 109 into conduction. Then the collector current of this Darlington pair diverts some of the forward base current from the Darlington pair 100, 101 and reduces the output voltage produced by the system to the level required to hold the desired value of voltage across capacitor 26.

When the capacitor voltage goes negative during an output pulse produced by the system of FIG. 1, the negative voltage reflects back and drives the collectors of Darlington pair 100, 101 negative. The feedback winding 115 voltage is of a sense to increase the forward base drive of these transistors. The negative voltage at the collectors of the Darlington pair 100, 101 causes these two transistors to operate backward with collectors acting like emitters and vice versa. Base current flowing into transistor 101 turns it on and its collector-emitter paths shorts across the emitter-base (actually the collector-base) path of transistor 100. Thus, transistor 100 is held off and transistor 101, although on, has no real current path so the only current flow is small and is in the direction from the base of transistor 101 to the collector (acting as an emitter) of transistor 101. The breakdown in the reverse direction of transistor 100, is about −10 volts. If this transistor does break down, the current is limited to the reflected secondary current of transformer 20 and is not damaging to the output transistors.

Resistor 104 is used to limit the current through transistor 108 and 109 to prevent damage to these transistors. The diode 107, resistor 106 combination, is used to prevent a higher reverse impedance than forward impedances. This is done because the reverse voltage is higher than the forward voltage. Resistor 110 is used for bias stability.

In one particular design of the circuit, the elements of FIG. 1 had the following values. These are given by way of example.

resistors
- 50 - 100 ohms
- 54 - 1 K ohm
- 56 - 270 ohms
- 58 - 27 ohms
- 85 - 3.9 K ohms capacitors
- 44 - 1 μF
- 64 - 0.25 μF
- 78 - 1 μF
- 26 - 3 μF SCR 30 — type 2N3525

The value of resistor 68 will depend upon the range of engine speeds expected. At a speed range of 4,000–6,000 RPM, the value may be 2.2 K ohms; at 7,000–10,000 RPM, 330 ohms; and at 10,000–15,000 RPM, the value may be zero and in this case the diode 66 should be removed from the circuit. In this example, the number of cylinders is assumed to be eight so that the frequency of the points is four times the engine speed. The points are normally opened about 30% of the time.

The mechanical breaker points 80, illustrated in FIG. 1 are intended as an example only. In many cars these days, points have been eliminated and replaced by a magnetic or inductive pickup (in some "after market"

designs photo-couplers are employed). The signals produced by such transducers are amplified and conditioned to operate an electronic switch such as a transistor, rather than the points shown, so that the electronic switch is opened and closed in proper synchronization with the engine. The system illustrated in FIG. 1 works equally well with the mechanical switch 80 replaced with such an electronic switch. It is therefore intended that the terms "switch," "switch means" or the like be construed to be generic both to electronic and mechanical versions of the same.

While the present invention has been described in terms of an automobile ignition system, it is to be understood that the invention is not limited to this use. That is, the load driven may be one other than the distributor circuit of an automobile and the switch 30 may be other than a SCR. The circuit is useful in many applications where high noise immunity is desired.

What is claimed is:

1. A triggering circuit for a controlled rectifier having an anode, a cathode connected to a point of reference potential and having a gate electrode comprising, in combination:

a capacitor having a first plate connected to said reference potential and having a second plate;

a first switch for selectively connecting the second plate of said capacitor to said point of reference potential;

a first transistor having an emitter electrode connected to the second plate of said capacitor, having a collector electrode connected to the gate electrode of said controlled rectifier, and having a base electrode;

means for applying a bias potential to the base electrode of said first transistor for conditioning said first transistor to be nonconductive so long as the potential at said second plate does not depart from said reference potential by more than a predetermined value in the sense for tending to turn said first transistor on;

a charging circuit connected across said capacitor for charging said capacitor in said sense for tending to turn on said transistor whenever said first switch does not connect the second plate of said capacitor to said point of reference potential, thereby to prevent the charging of said capacitor; and means for automatically clamping the gate electrode of said controlled rectifier to a potential a given time after said first transistor turns on, each time said first transistor turns on, thereby conditioning said controlled rectifier to turn off in response to reversal of the voltage at its anode electrode.

2. A triggering circuit as set forth in claim 1 wherein said means connecting the collector electrode of said first transistor to the gate electrode of said controlled rectifier includes a second capacitor for blocking protracted d-c flow, thereby to cause saturation of said first transistor after d-c flow is established by the triggering of the controlled rectifier.

3. A triggering circuit as set forth in claim 2 wherein said means for applying a bias voltage has a terminal for an operating voltage and a voltage divider connected between said terminal and said point of reference potential, said voltage divider comprising:

a first resistance connected for providing a d-c conductive path between said terminal and the base electrode of said first transistor;

said direct current conductive means between the base electrodes of said first and second transistors; and a second resistance connected for providing a d-c conductive path between the base electrode of said second transistor and said point of reference potential.

4. A triggering circuit as set forth in claim 1 wherein said means for automatically clamping the gate electrode of said controlled rectifier to a potential a given time after said first transistor turns on, each time said first transistor turns on, includes:

means connecting the collector electrode of said first transistor to the gate electrode of said controlled rectifier for causing said first transistor to saturate after triggering said controlled rectifier and thereby to have increased base current flow;

a normally open second switch connected between the gate electrode of said controlled rectifier and said point of reference potential; and means, included in said means for applying a bias potential to the base electrode of said first transistor, responsive to said increase in the base current flow of said first transistor during its saturation for closing said second switch, thereby placing the gate electrode of said controlled rectifier at a potential such that said controlled rectifier can turn off in response to reversal of the voltage at its anode electrode.

5. A triggering circuit as set forth in claim 4 wherein said second switch comprises a second transistor having a conduction path and a control electrode, said conduction path being connected between the gate electrode of said controlled rectifier and said point of reference potential, and wherein said means responsive to said increase in the base current flow of said first transistor during its saturation for closing said second switch comprises means for developing a voltage proportionally responsive to the base current flow of said first transistor and means for applying this voltage to the control electrode of said second transistor.

6. A triggering circuit as set forth in claim 4 wherein the first transistor is of one conductivity type and wherein said second switch includes a second transistor of opposite conductivity type having an emitter electrode connected to said point of reference potential, having a collector electrode connected to the gate electrode of said controlled rectifier, and having a base electrode and wherein the means responsive to said increase in the base current flow of said first transistor during its saturation for closing said second switch includes direct current conductive means between the base electrode of said first transistor and the base electrode of said second transistor, for coupling the base electrode of said first transistor to the base electrode of said second transistor.

7. A triggering circuit as set forth in claim 3 wherein said direct current conductive means between the base electrodes of said first and second transistors includes a third resistance and a further capacitor shunting at least a major portion of said third resistance.

8. A triggering circuit as set forth in claim 4 wherein said means connecting the collector electrode of said first transistor to the gate electrode of said controlled rectifier comprises differentiating means which include:

a capacitor;

a unilateral resistance exhibiting relatively easy conduction of current in a first direction and relatively difficult conduction in a second direction opposite to said first direction; and means connecting said capacitor, in series with said unilateral resistance between the collector electrode of said first transistor and the gate electrode of said controlled rectifier, with said unilateral resistance poled for easy conduction of the collector current of said first transistor.

9. A capacitor discharge ignition circuit comprising, in combination:

a silicon controlled rectifier (SCR) having anode, cathode and gate electrodes, connected at its cathode electrode to a point of reference potential;

a transformer having a primary winding;

a first capacitor connected essentially in series with said primary winding across the anode-to-cathode path of said SCR;

means coupled across said capacitor for supplying current pulses in a given polarity thereacross, said polarity being such as to develop a direct voltage across said capacitor in a sense to cause current flow in the forward direction through the anode-to-cathode path of said SCR;

a transistor having emitter, base and collector electrodes;

a second capacitor connected between said emitter electrode and said point of reference potential;

means connected to said base electrode for supplying a reverse bias potential thereto;

means coupling said collector electrode to the gate electrode of said SCR;

a charging circuit connected across said second capacitor in a sense to produce a voltage across said second capacitor, when it charges, for causing a flow of current in the forward direction through the emitter-to-collector path of said transistor;

switch means connected across said second capacitor;

means for operating said switch means between closed and open conditions, said switch means, when closed, preventing said second capacitor from charging whereby said transistor remains in the off condition and, when open, permitting said capacitor to charge, whereby when the voltage across said second capacitor reaches a level sufficient to overcome the reverse bias on said base electrode, said transistor turns on and supplies a trigger pulse to the gate electrode of said SCR; and means for automatically clamping said gate electrode to substantially said reference potential a given interval of time after said transistor turns on, thereby conditioning said SCR to turn off when its anode voltage reverses upon discharge of said first capacitor through said primary winding and anode-to-cathode path.

10. A capacitor discharge circuit as set forth in claim 9, wherein said means for automatically clamping comprises means responsive to base current flow through said transistor.

11. A capacitor discharge circuit as set forth in claim 10, wherein said means for clamping comprises a second transistor of opposite conductivity type to the first-mentioned transistor, having a base electrode coupled to the base electrode of the first-mentioned transistor and a collector-to-emitter path connected between said gate electrode and said point of reference potential.

12. A circuit for suppressing the effect of switch bounce comprising, in combination:

a first capacitor having a first plate connected to a point of reference potential and having a second plate:

a switch connected across the capacitor;

a transistor having emitter and base electrodes and an emitter-base junction therebetween and having a collector electrode, connected at its emitter electrode to the second plate of said first capacitor;

means coupled between said base electrode and said point of reference voltage for applying a bias potential to said base electrode which conditions said transistor for non-conduction so long as its emitter potential does not depart sufficiently from said reference potential to permit forward conduction of its emitter-base junction;

a second capacitor;

a load circuit having a first terminal to which is connected via said second capacitor said collector electrode and having a second terminal connected to said point of reference potential;

a charging circuit connected across said first capacitor for charging the same, when said switch is open, in a sense to turn on said transistor when the voltage across said first capacitor, that is, the voltage at said emitter electrode, reaches a level in excess of said bias potential by an amount sufficient to forward-bias said emitter-base junction, said switch, when closed, serving to discharge said first capacitor to thereby turn off said transistor; and means responsive to base current flow of greater than a given value through said transistor, for clamping the first terminal of said load circuit to said point of reference potential.

13. A circuit as set forth in claim 12 wherein said load circuit comprises the gate electrode-to-cathode electrode path of a silicon controlled rectifier (SCR).

14. A circuit as set forth in cliam 12 wherein said means for clamping comprises a second transistor having a base electrode and a collector-to-emitter path, said path being connected between the first terminal of said load circuit and said point of reference potential, and said base electrode of said second transistor being coupled to the base electrode of the other transistor, said second transistor being of opposite conductivity type than the other transistor.

15. A triggering circuit for a controlled rectifier having anode, cathode and gate electrodes, comprising:

a capacitor;

a transistor having emitter, base and collector electrodes, said emitter electrode being connected to one terminal of said capacitor, said collector electrode being connected to the gate electrode, said capacitor having the other terminal thereof commonly connected along with the cathode electrode to a reference potential;

means for applying a bias potential at said base electrode to render said transistor non-conductive so long as the potential at said emitter electrode does not depart from said reference potential by more than a predetermined value in the sense of polarity tending to turn said transistor on;

means for charging said capacitor relative to said reference potential and for discharging said capacitor to said reference potential, the potential at said emitter reaching the turn-on level of said transistor to supply a controlled rectifier turn-on signal at the gate electrode each time said capacitor is charged; and means for attenuating the signal level on the gate electrode below the turn-on level of the controlled rectifier each time said transistor reaches saturation and thereby conditioning the controlled rectifier to turn-off when the potential between its anode and cathode changes to a reversed polarity.

* * * * *